(12) United States Patent
Wildes et al.

(10) Patent No.: US 6,974,333 B2
(45) Date of Patent: Dec. 13, 2005

(54) HIGH-DENSITY CONNECTION BETWEEN MULTIPLE CIRCUIT BOARDS

(75) Inventors: Douglas Glenn Wildes, Ballston Lake, NY (US); Robert Stephen Lewandowski, Amsterdam, NY (US); Geir Ultveit Haugen, Oslo (NO)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/813,945

(22) Filed: Mar. 30, 2004

(65) Prior Publication Data

US 2005/0221633 A1    Oct. 6, 2005

(51) Int. Cl.⁷ .............................................. H01R 12/00
(52) U.S. Cl. ........................................ 439/67; 257/286
(58) Field of Search ................... 439/65–67; 257/700, 257/685; 361/790

(56) References Cited

U.S. PATENT DOCUMENTS

| | | | | |
|---|---|---|---|---|
| 4,733,461 A | * | 3/1988 | Nakano | 29/830 |
| 5,043,794 A | * | 8/1991 | Tai et al. | 257/686 |
| 5,160,269 A | | 11/1992 | Fox, Jr. et al. | 439/67 |
| 5,225,709 A | * | 7/1993 | Nishiuma et al. | 257/700 |
| 5,376,825 A | * | 12/1994 | Tukamoto et al. | 257/685 |
| 5,378,161 A | | 1/1995 | Loder | 439/77 |
| 5,701,233 A | * | 12/1997 | Carson et al. | 361/735 |
| 5,871,362 A | | 2/1999 | Campbell et al. | 439/67 |
| 5,893,765 A | * | 4/1999 | Farnworth | 439/91 |
| 6,007,490 A | | 12/1999 | Pawluskiewicz | 600/459 |
| 6,017,244 A | | 1/2000 | Daane | 439/495 |
| 6,049,467 A | * | 4/2000 | Tamarkin et al. | 361/790 |
| 6,162,065 A | | 12/2000 | Benham | 439/67 |
| 6,309,223 B1 | | 10/2001 | Wolfe | 439/67 |
| 6,387,729 B2 | * | 5/2002 | Eng et al. | 438/106 |
| 6,437,557 B1 | | 8/2002 | Smith | 324/158.1 |
| 6,520,789 B2 | | 2/2003 | Daughert, Jr. et al. | 439/329 |

* cited by examiner

Primary Examiner—Michael C. Zarroli
(74) Attorney, Agent, or Firm—Fletcher Yoder

(57) ABSTRACT

A high-density connection of multiple circuit boards having overlapping ends arranged in a stack. The metal traces on the stacked circuit boards are electrically connected by contact of the ends of the traces, which ends may be pads. The stacked circuit boards can be clamped, soldered or bonded together. Multiple circuit boards may be connected to a single circuit board. In one embodiment, double-sided circuit boards are stacked so that a first circuit board connects to a second circuit board through a third circuit board disposed intermediate the first and second circuit boards. The circuit boards may be flexible or rigid.

25 Claims, 9 Drawing Sheets

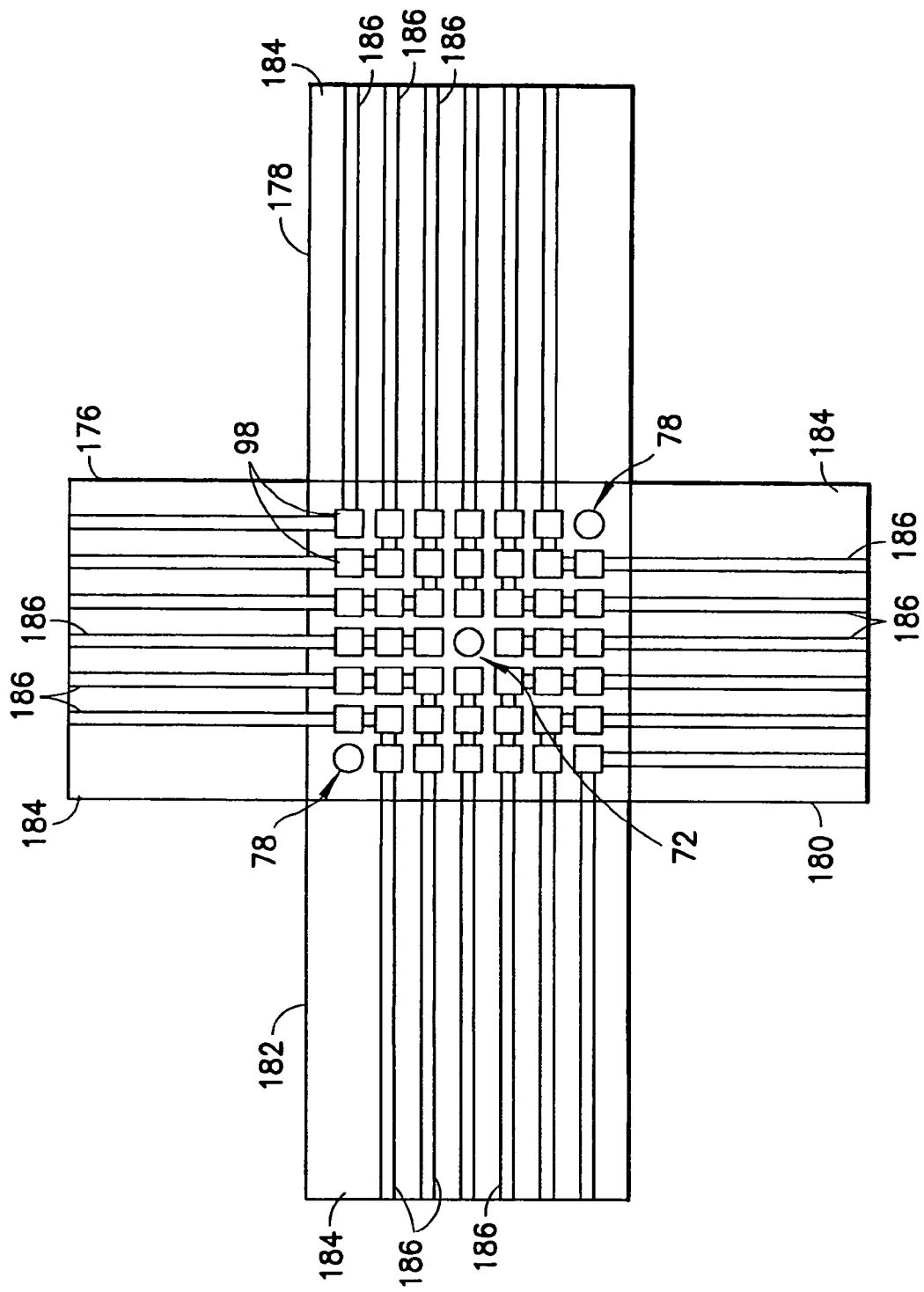

HIGH-DENSITY CONNECTION BETWEEN MULTIPLE CIRCUIT BOARDS

BACKGROUND OF THE INVENTION

This invention generally relates to high-density electrical connectors. In particular, the invention relates to high-density electrical connectors for connecting multiple circuit boards.

A particular application of the invention is the manufacture of ultrasound probes for medical applications. As the number of transducer elements in typical ultrasound probes increases and the desired size of the probe handle and other packaging decreases, there is a need to increase the density of electrical connections between the transducer elements and the probe cable. For reasons of manufacturability and economics, the transducer pallet and cable are usually built and tested as separate subassemblies, then joined. If the pallet and cable each terminate in a flexible printed circuit, then the preferred joint is a flex-to-flex bond. Such a bond comprises one or more rows of metallized connection pads on the transducer pallet flex circuit, similar row(s) of pads on the cable flex circuit, and an anisotropic conductive adhesive which, under heat and pressure, forms an electrical and mechanical bond between corresponding connection pads of the two flex circuits.

Flexible printed circuit substrates are typically made of a polyimide, such as Kapton™ (a DuPont product), with a typical thickness within the range of 25 to 75 microns. Another flexible printed circuit substrate material conventionally employed is polyester.

Electrical connection bonds between two flex circuits or between a flex circuit and a rigid circuit board are used in various situations and products, not just during the manufacture of ultrasound arrays. A major application is electrical connection to flat panel (LCD) displays for appliances, computers, and aircraft.

Two-dimensional ultrasound transducer arrays for medical diagnostic imaging are typically built with one flex circuit per row of transducer elements. Electrical connection to the transducer array typically requires connection to a stack of 30 to 60 flex circuits. In a typical conventional ultrasound imaging system, beamforming is performed inside the console and there is a one-to-one correspondence between transducer elements and coaxial conductors. For probes with very large numbers of transducer elements, however, it is desirable to perform at least a portion of the beamforming inside the probe head, e.g., by connecting groups of transducer elements to corresponding transmit and/or receive beamformer circuits. Connection between elements is easy within or parallel to the flex circuits, but difficult between flex circuits.

Historically, some transducer probe manufacturers have soldered coaxial cables directly to the transducer flex circuits, or have used a separate connector for each flex circuit. U.S. Pat. No. 6,007,490 discloses the use of a solderless connection for connecting and disconnecting flex circuits inside an ultrasonic transducer probe. The connector comprises a cover section and a receiver section that compress the ends of two flex circuits together. Means for aligning the flex circuits are incorporated in the cover and receiver sections, which are fastened together to hold the compressed ends of the flex circuits in place. Multiple flex circuits can be electrically connected in this way. One embodiment disclosed in U.S. Pat. No. 6,007,490 comprises a flex circuit with exposed conductors on both sides connected to respective flex circuits on opposing sides.

U.S. Pat. No. 5,160,269 discloses a connector system for interconnecting single or multiple pairs of flex circuits. A single pair of clamping bodies interconnects the respective ones of multiple pairs of electrical conductors (in the form of conductor traces carried on respective pairs of flexible substrates) by pressing the flex circuits together between slender fluid-filled flexible bladders held in channels defined in the confronting sides of the clamping bodies. Alignment pins keep the flex circuits and clamping bodies aligned properly with each other, and alignment portions of the flex circuits correspond in thickness to that of the electrically interconnecting portions, to keep the flex circuits and clamping bodies parallel with each other. The clamping bodies are urged toward one another by clamping screws.

The assignee of U.S. Pat. No. 5,160,269 subsequently developed and sold a clamp connector for use with two-dimensional ultrasonic transducer arrays. The clamp connected each transducer flex circuit to one similar cable flex circuit. Coaxial conductors were soldered to the cable circuit; the transducer circuits were embedded in the transducer. All pairs of flex circuits were stacked together within the single clamp. The clamp provided a way to make a simple, reworkable one-to-one connection between many flex circuits at one time.

There is a need for a connection scheme that would allow elements (e.g., transducer elements) connected to one printed circuit board (flexible or rigid) to be connected to elements connected to another printed circuit board (flexible or rigid). There is also a need for a connection scheme that would increase the density of connections, e.g., by allowing more than two circuit boards to be connected to one end of a single circuit board.

BRIEF DESCRIPTION OF THE INVENTION

The present invention provides a connection scheme that allows elements connected to one printed circuit board (flexible or rigid) to be connected to elements connected to another printed circuit board (flexible or rigid). This capability is especially useful in the case of an ultrasonic transducer probe that performs a portion of the beamforming function. The invention also enables the connection of more than two circuit boards (flexible or rigid) to one end of a single circuit board (flexible or rigid). The multiple circuit boards can be held in place by a clamp, solder bonding, anisotropic conductive film or any other suitable means.

One aspect of the invention is a stacked connection comprising first, second and third circuit boards having respective overlapping portions, the first circuit board comprising a substrate supporting first and second sets of electrical conductors, the second circuit board comprising a substrate supporting first and second sets of electrical conductors, and the third circuit board comprising a substrate supporting a set of electrical conductors, wherein the second set of electrical conductors of the second circuit board are respectively in contact with the second set of electrical conductors of the first circuit board, and the set of electrical conductors of the third circuit board are respectively electrically coupled to the first set of electrical conductors of the first circuit board by way of the first set of electrical conductors of the second circuit board.

Another aspect of the invention is a stacked connection comprising: first circuit board comprising a substrate and first and second sets of electrical conductors supported by the substrate, the electrical conductors of the first set extending beyond the electrical conductors of the second set, and each of the electrical conductors of the first and second sets having a respective termination portion that is exposed on one side of the substrate, the termination portions of the electrical conductors of the first set being displaced in a direction perpendicular to the substrate of the first circuit board relative to the termination portions of the electrical conductors of the second set; a second circuit board comprising a substrate and a set of electrical conductors supported by the substrate of the second circuit board, each of the electrical conductors of the second circuit board having a respective termination portion that is exposed on one side of the substrate of the second circuit board, the termination portions of the electrical conductors of the second circuit board being respectively in contact with the termination portions of the electrical conductors of the first set of the first circuit board; and a third circuit board comprising a substrate and a set of electrical conductors supported by the substrate of the third circuit board, each of the electrical conductors of the third circuit board having a respective termination portion that is exposed on one side of the substrate of the third circuit board, the termination portions of the electrical conductors of the third circuit board being respectively in contact with the termination portions of the electrical conductors of the second set of the first circuit board.

A further aspect of the invention is a stacked connection comprising: a first circuit board comprising a substrate and first and second sets of electrical conductors supported by the substrate, each of the electrical conductors of the first and second sets having a respective termination portion that is exposed on one side of the substrate; a second circuit board comprising a substrate and first and second sets of electrical conductors supported by the substrate of the second circuit board, each of the electrical conductors of the first set of the second circuit board having a respective termination portion that is exposed on one side of the substrate of the second circuit board, and each of the electrical conductors of the second set of the second circuit board having a respective first termination portion that is exposed on the one side of the substrate of the second circuit board and a respective second termination portion that is exposed on a side of the substrate of the second circuit board opposite to the one side of the substrate of the second circuit board, the termination portions of the electrical conductors of the first set of the second circuit board and the first termination portions of the electrical conductors of the second set of the second circuit board being respectively in contact with the termination portions of the electrical conductors of the first and second sets of the first circuit board; and a third circuit board comprising a substrate and a set of electrical conductors supported by the substrate of the third circuit board, each of the electrical conductors of the set of the third circuit board having a respective termination portion that is exposed on one side of the substrate of the third circuit board, the termination portions of the electrical conductors of the set of the third circuit board being respectively in contact with the second termination portions of the electrical conductors of the second set of the second circuit board, whereby the set of electrical conductors of the third circuit board are electrically connected to the second set of electrical conductors of the first circuit board by means of the second set of electrical conductors of the second circuit board.

Yet another aspect of the invention is an apparatus comprising first and second stacked connections and a spacer disposed between the first and second stacked connections, the first stacked connection comprising first and second circuit boards, the second stacked connection comprising third and fourth circuit boards, wherein the spacer comprises a first set of electrical conductors, the first circuit board comprises a second set of electrical conductors, and the fourth circuit board comprises a third set of electrical conductors, the electrical conductors of the second set being respectively electrically connected to the electrical conductors of the third set by way of the electrical conductors of the first set.

A further aspect of the invention is an apparatus comprising first, second and third stacked connections, a first spacer disposed between the first and second stacked connections, and a second spacer disposed between the second and third stacked connections, each of the first, second and third stacked connections comprising a respective plurality of circuit boards, wherein the second spacer comprises a hole and each circuit board of the second stacked connection comprises a respective opening, further comprising a first alignment pin anchored in the first spacer and projecting through the openings in the circuit boards of the second stacked connection and into the hole in the second spacer.

Another aspect of the invention is a stack of partially overlapping circuit boards, comprising: a central circuit board comprising a substrate and first through fourth sets of electrical conductors, each of the electrical conductors having a termination portion, wherein the termination portions of the electrical conductors of the first and second sets are exposed on one side of the substrate, and the termination portions of the electrical conductors of the third and fourth sets are exposed on another side of the substrate opposite to the one side of the substrate; first and second interior circuit boards each comprising a respective substrate and respective first and second sets of electrical conductors having termination portions, the termination portions of the first set of electrical conductors of the first interior circuit board being respectively in contact with the termination portions of the first set of electrical conductors of the central circuit board, the termination portions of the second set of electrical conductors of the first interior circuit board being respectively in contact with the termination portions of the second set of electrical conductors of the central circuit board, the termination portions of the first set of electrical conductors of the second interior circuit board being respectively in contact with the termination portions of the third set of electrical conductors of the central circuit board, and the termination portions of the second set of electrical conductors of the second interior circuit board being respectively in contact with the termination portions of the fourth set of electrical conductors of the central circuit board; and first and second exterior circuit boards each comprising a respective substrate and a respective set of electrical conductors, the set of electrical conductors of the first exterior circuit board being electrically connected to the second set of electrical conductors of the central circuit board by way of the second set of electrical conductors of the first interior circuit board, and the set of electrical conductors of the second exterior circuit board being electrically connected to the fourth set of electrical conductors of the central circuit board by way of the second set of electrical conductors of the second interior circuit board.

Other aspects of the invention are disclosed and claimed below.

BRIEF DESCRIPTION OF THE DRAWINGS

FIG. 9 is a drawing showing a top view of a connector clamped stack in accordance with a further embodiment of the invention.

Reference will now be made to the drawings in which similar elements in different drawings bear the same reference numerals.

DETAILED DESCRIPTION OF THE INVENTION

Figure 1:
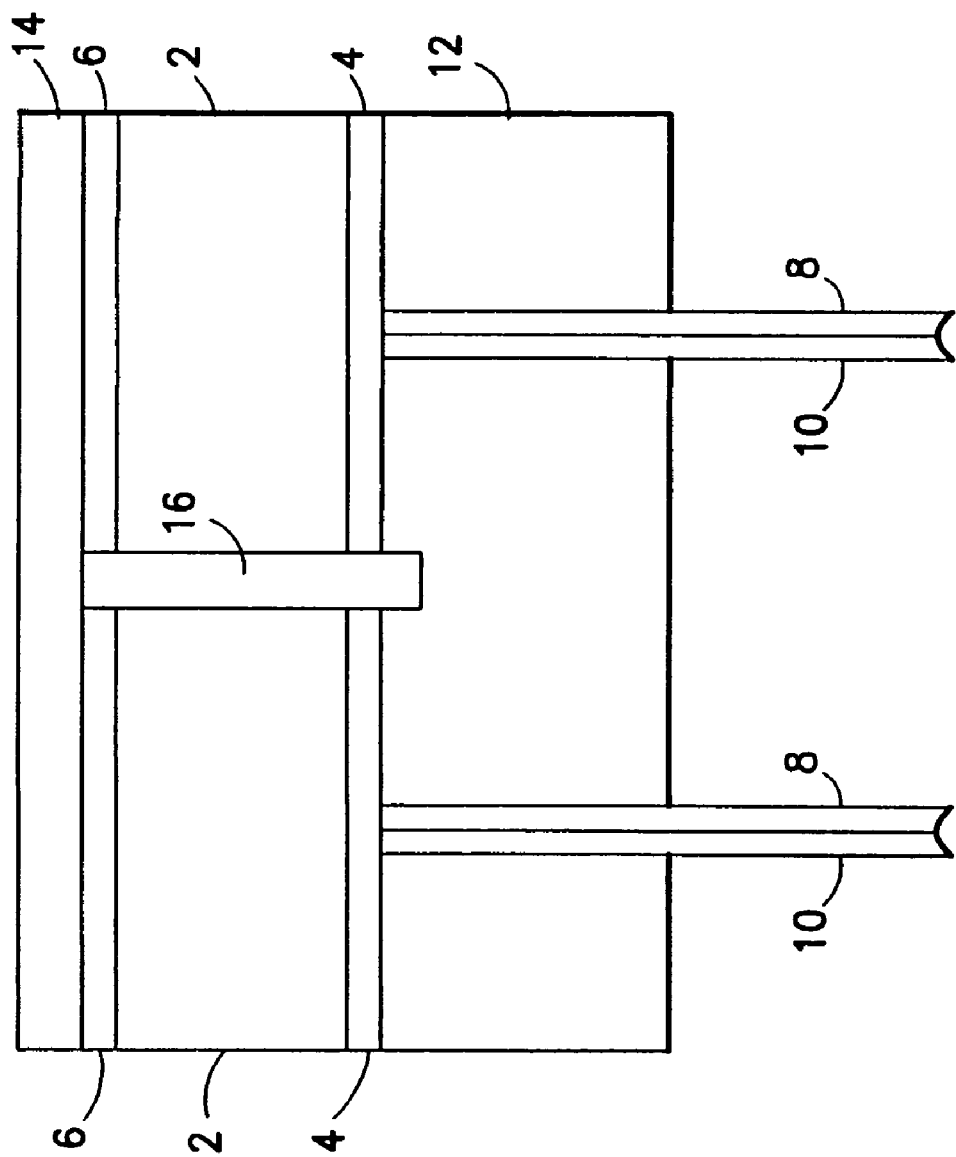
FIG. 1 is a drawing showing one element of an ultrasound transducer array having an acoustic backing acoustically coupled to the rear surfaces of the transducer elements.

FIG. 1 shows an exemplary ultrasound transducer element comprising a piezoelectric ceramic layer 2 having a bottom surface that has been metallized to form a signal electrode 4 and a top surface that has been metallized to form a ground electrode 6. An acoustic impedance matching layer 14 made of electrically conductive material is joined to the metallized top surface of the ceramic by a thin (acoustically transparent) layer of epoxy (not shown) that allows ohmic contact between the matching layer 14 and the ground electrode 6. As partly depicted in FIG. 1, matching layer 14 is common to all transducer elements, meaning that it covers the entire array and is in electrical contact with the ground electrodes of all transducer elements in the array, only two transducer elements being shown in FIG. 1.

The transducer array is set over a patterned array of electrical signal connectors. One example of such an array of electrical connectors is a series of spaced and mutually parallel flex circuits embedded within an acoustic backing 12 (only a portion of which is shown in FIG. 1), such that the ends of each trace 8 imprinted on each dielectric substrate 10 (e.g., Kapton®) polyimide film) are exposed at the surface of the acoustic backing. In a two-dimensional array, the transducer elements of each column are respectively electrically connected to traces arrayed on a respective dielectric substrate. Thus there will be one flex circuit per column in the transducer array. FIG. 1 shows two flex circuits corresponding to two columns of ultrasound transducer elements and also shows only one metal trace 8 on each dielectric substrate 10 electrically connected to a respective transducer element in each column.

The acoustic backing 12 is joined to the metallized bottom surface of the ceramic by a thin (acoustically transparent) layer of epoxy (not shown) that allows ohmic contact between the signal electrode 4 and the exposed end of the metal trace 8. Alternatively, a metal pad may be formed over the exposed end of the metal trace, with ohmic contact then occurring between the signal electrode and the metal pad.

Preferably, the acoustic backing is joined to the transducer array layer before the respective columns are diced and before the acoustic impedance matching layer is installed. In that event, the saw may cut to a depth that enters the acoustic backing 12, as seen in FIG. 1. A representative kerf 16 is shown in FIG. 1. The kerf 16 acoustically isolates the transducer elements in one column from the adjacent transducer elements in adjacent columns. Kerf 16 also electrically isolates the signal electrodes 4 of adjacent transducer elements in adjacent columns. Dicing in an orthogonal direction will produce kerfs (not shown) that acoustically isolate the transducer elements of a given row from each other and that electrically isolate the signal electrodes of those same transducer elements.

Figure 2:
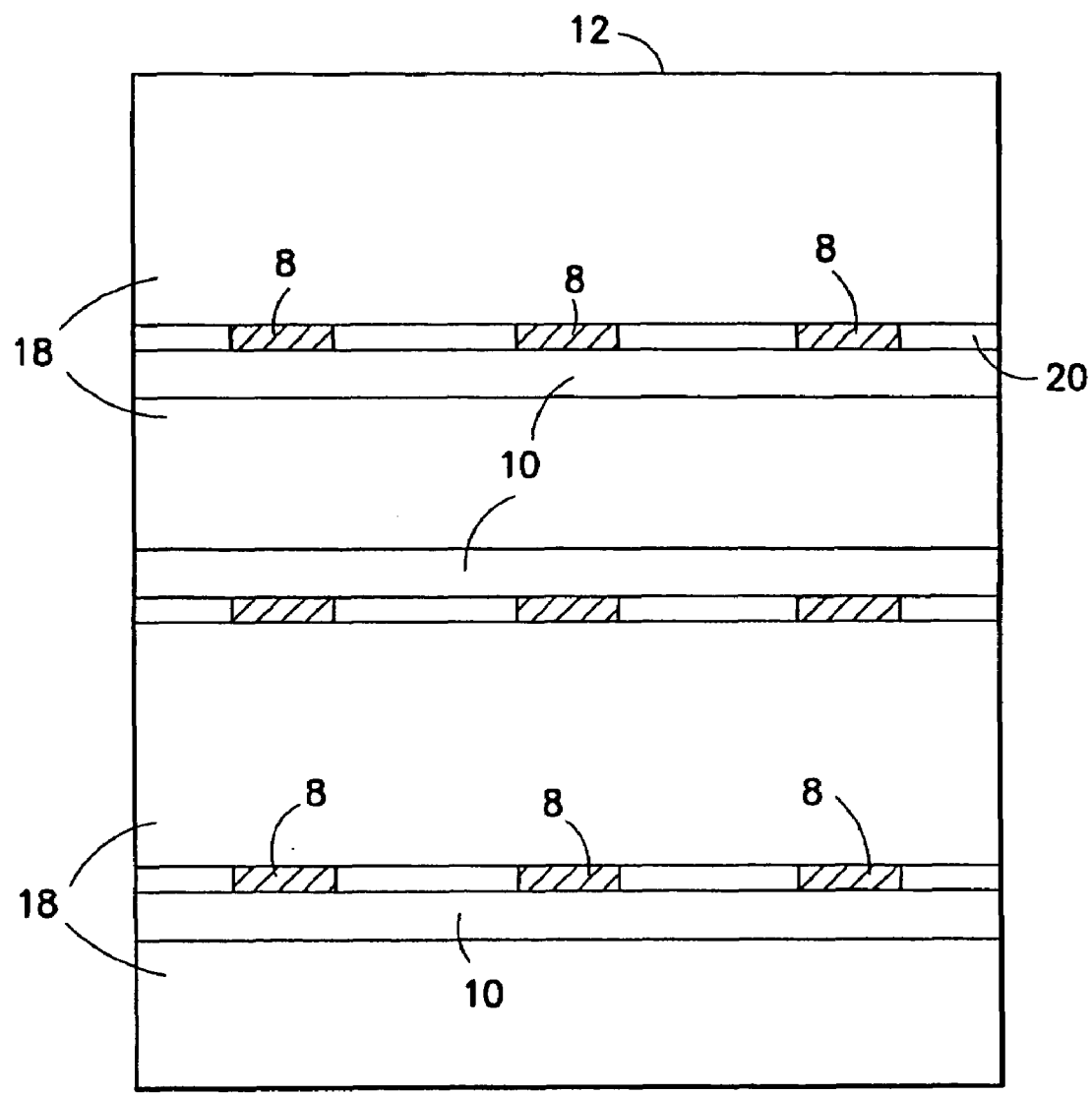
FIG. 2 is a drawing showing a cross section of an acoustic backing stack comprising a multiplicity of embedded flex circuits comprising signal traces.

FIG. 2 shows the acoustic backing 12 in more detail and in cross section. The acoustic backing 12 comprises a stack of alternating layers 18 of acoustic backing material and flex circuits. Each flex circuit comprises a dielectric substrate 10 and a multiplicity of metal traces 8. The flex circuits are bonded to the adjoining layers of acoustic backing material by thin layers of epoxy 20 on both sides of the flex circuit. The thickness of the layers of epoxy and the metal traces have been exaggerated in FIG. 2 for the sake of illustration. Each flex circuit may carry both signal traces and ground traces, with the number of signal traces greatly outnumbering the number of ground traces. It should also be noticed that in the stack shown in FIG. 2, the flex circuits can be laminated to the layers of acoustic backing material with the metal traces facing in either direction. This allows the flex circuits with metal traces on opposite sides to be connected to a cable flex circuit having metal traces on both sides.

Figure 3:
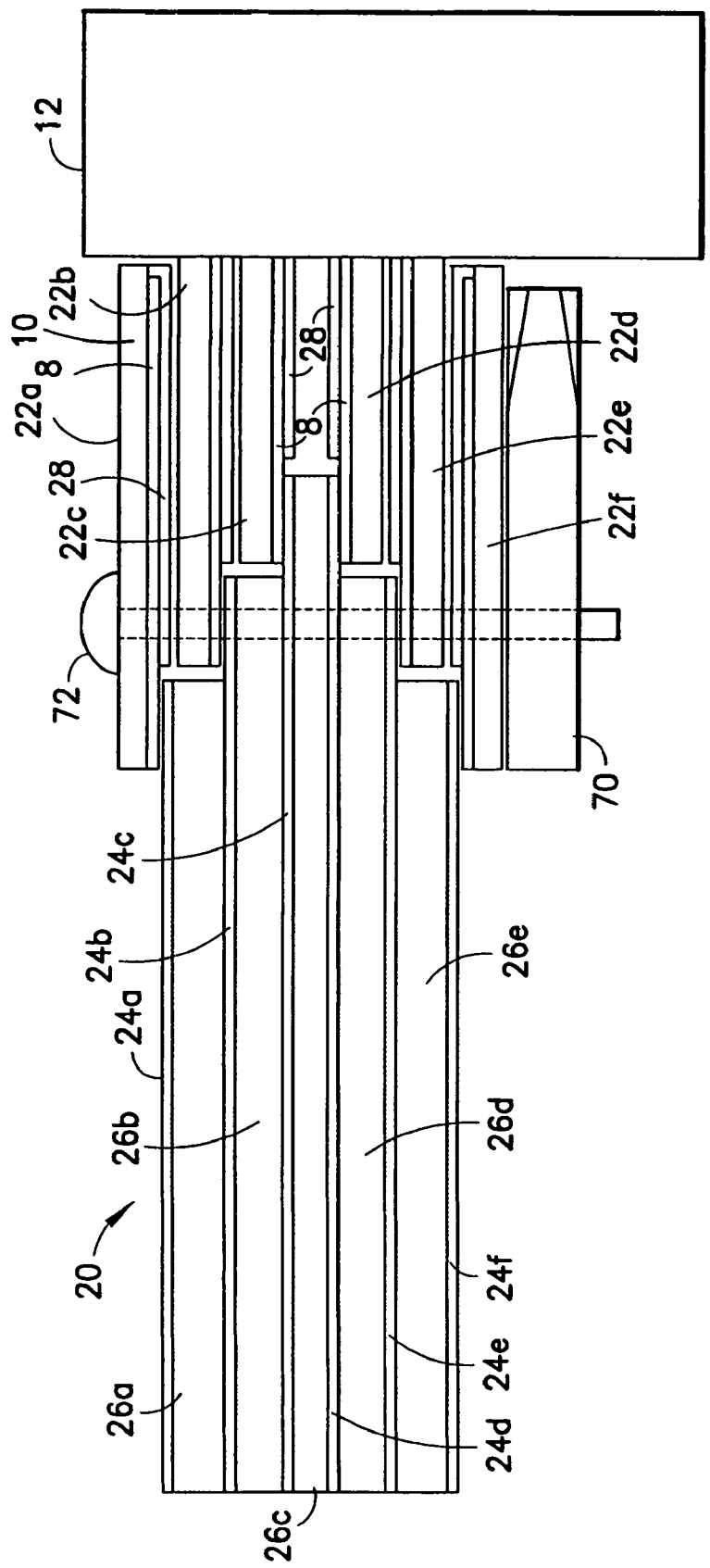
FIG. 3 is a drawing showing a side view of a portion of a connector clamped stack in accordance with one embodiment of the invention.

FIG. 3 shows a side view of a portion of a connector clamped stack in accordance with one embodiment of the invention. In this example, six transducer flex circuits 22a through 22f (each connected, e.g., to a respective row or column of transducer elements) are electrically connected to each single multi-layer electronics or cable flex circuit 20. Only one flex circuit 20 is shown in FIG. 3, but in actuality a clamped connection stack will be formed by repeating the connection scheme shown in FIG. 3 multiple times. A respective spacer 70 (only one of which is shown in FIG. 3) is placed between each group of flex circuits in the stack. The spacer 70 acts as a pressure pad when the clamp is tightened to clamp the stack of flex circuits together. Only the bolt 72 of the clamping arrangement is shown in FIG. 3. The clamping arrangement will be described in more detail later with reference to FIG. 7. Although this particular example uses flex circuits, it should be understood that rigid printed circuit boards could also be arranged in the manner shown in FIG. 3. Alternatively, board 20 could be a rigid circuit board electrically connected to flex circuits 22a through 22f.

Furthermore, it should be appreciated that circuit boards comprising conductors or traces distributed at different elevations are referred to herein as "multi-level" for the sake of convenience. The present invention should not be limited to any particular internal distribution of conductors in a "multi-level" circuit board. Given a particular surface distribution of the ends of the conductors, the internal distribution of those conductors in the circuit board may take many forms. In particular, although this disclosure describes embodiments having conductors or traces at certain "levels", it should be appreciated that the conductors in any particular "level" need not all be at the same elevation.

In accordance with one embodiment, the spacer material may be stiff, yet compliant. For instance, a very stiff rubber or a low-modulus plastic could be used. The compliance would accommodate variations in the thickness or flatness of the circuit boards; the stiffness would keep everything relatively flat and parallel.

In practice, the flex circuits and multi-layer Kapton™ circuit boards that will be used are quite flat and uniform in thickness. The metal pattern on the circuits has been carefully designed so that all surfaces have the same pattern (so total stacked thickness and therefore pressure are uniform). In this case, the spacer can be made of a very stiff (not compliant at all) material, such as stainless steel.

The more significant property for the spacer material appears to be its coefficient of thermal expansion (CTE). Kapton™ and copper circuits, stainless steel spacers, and a stainless steel bolt work well together. When aluminum spacers were substituted in an attempt to save weight, electrical contact between the circuits was lost at low temperatures (the CTE for aluminum is 23 ppm/° C. vs. 17 ppm/° C. for stainless steel). Perhaps a more compliant spacer could be pre-compressed enough that it would maintain contact over a broad range of temperatures, but compliant materials have even higher CTE and would be an even worse mismatch to a stainless steel bolt. In theory, the spacers and bolt, and preferably also the circuit boards, should have well-matched CTEs.

Referring once again to FIG. 3, each cable flex circuit 20 comprises six sets 24a through 24f of metal traces separated by layers 26a through 26e of dielectric material. Each set 24a–24f comprises a multiplicity of spaced-apart metal traces that connect to respective coaxial conductors (not shown). Although in this example the conductors of a given set are generally mutually parallel and at the same elevation, neither condition is necessary to practice of the invention. For examples, the conductors of a given set could be on different levels, i.e., at different elevations. The spaces between metal traces in each set may be occupied by the same dielectric material as in layers 26a–26e. The end of cable flex circuit 20 that connects to the transducer flex circuits 22a–22f has a stepped structure that exposes the ends of the metal traces of embedded sets 24b–24e. More specifically, the central dielectric layer 26c projects beyond the adjacent inner dielectric layers 26b and 26d, thereby exposing the ends of the metal traces of embedded conductor sets 24c and 24d. Similarly, the inner dielectric layers 26b and 26d respectively project beyond the outer dielectric layers 26a and 26e, thereby exposing the ends of the metal traces of embedded conductor sets 24b and 24e. The metal traces of outer conductor sets 24a and 24f are already exposed.

As seen in FIG. 3, the stepped arrangement enables the ends of the metal traces on transducer flex circuit 22c to be placed in contact with the ends of the metal traces of embedded conductor set 24c of the cable flex circuit 20; and enables the ends of the metal traces on transducer flex circuit 22d to be placed in contact with the ends of the metal traces of embedded conductor set 24d when the stack is compressed by the clamp. Similarly, the stepped arrangement enables the ends of the metal traces on transducer flex circuit 22b to be placed in contact with the ends of the metal traces of embedded conductor set 24b; and enables the ends of the metal traces on transducer flex circuit 22e to be placed in contact with the ends of the metal traces of embedded conductor set 24e. Each flex circuit 22a–22f comprises a multiplicity of metal traces 8 printed on a dielectric substrate 10 with a cover layer 28 made, e.g., of acrylic that covers portions of the metal traces while leaving the ends of the traces exposed. As seen in FIG. 3, the flex circuits 22a–22c have metal traces on the bottom, while the flex circuits 22d–22f have metal traces on the top. The flex circuits 22a–22f are embedded in an acoustic backing 12 in the manner previously described. The metal traces on the respective flex circuits must be patterned so that their ends align and overlap when the stack is clamped. To facilitate electrical contact, contact pads can be formed at the ends of the metal traces.

In accordance with the embodiment depicted in FIG. 3, six circuit boards can be electrically connected to a single multi-layer circuit board having a stepped end with staggered layers. This connection scheme can be employed with either flexible or rigid circuit boards. Instead of a multi-layer circuit board having five layers of dielectric material, one with three layers could be used to connect to four circuit boards, instead of six. Obviously, this concept can be extended to connect more than six circuit boards to a single multi-layer circuit board.

Also, while FIG. 3 shows an embodiment in which the stepped end of the multi-layer circuit board (comprising an odd number of layers) is symmetrical, the concept can be extended to a circuit board having a stepped end that is asymmetrical. For example, in a variation of the embodiment shown in FIG. 3, the cable flex circuit 20 could consist of only dielectric layers 26a, 26b and 26c and metal trace sets 24a, 24b and 24c, respectively connected to transducer flex circuits 22a, 22b and 22c, in which case three transducer flex circuits would be connected to a single cable flex circuit. This variation could have a cable flex circuit with as few as two dielectric layers and two metal traces connected to only two transducer flex circuits.

Figure 4:
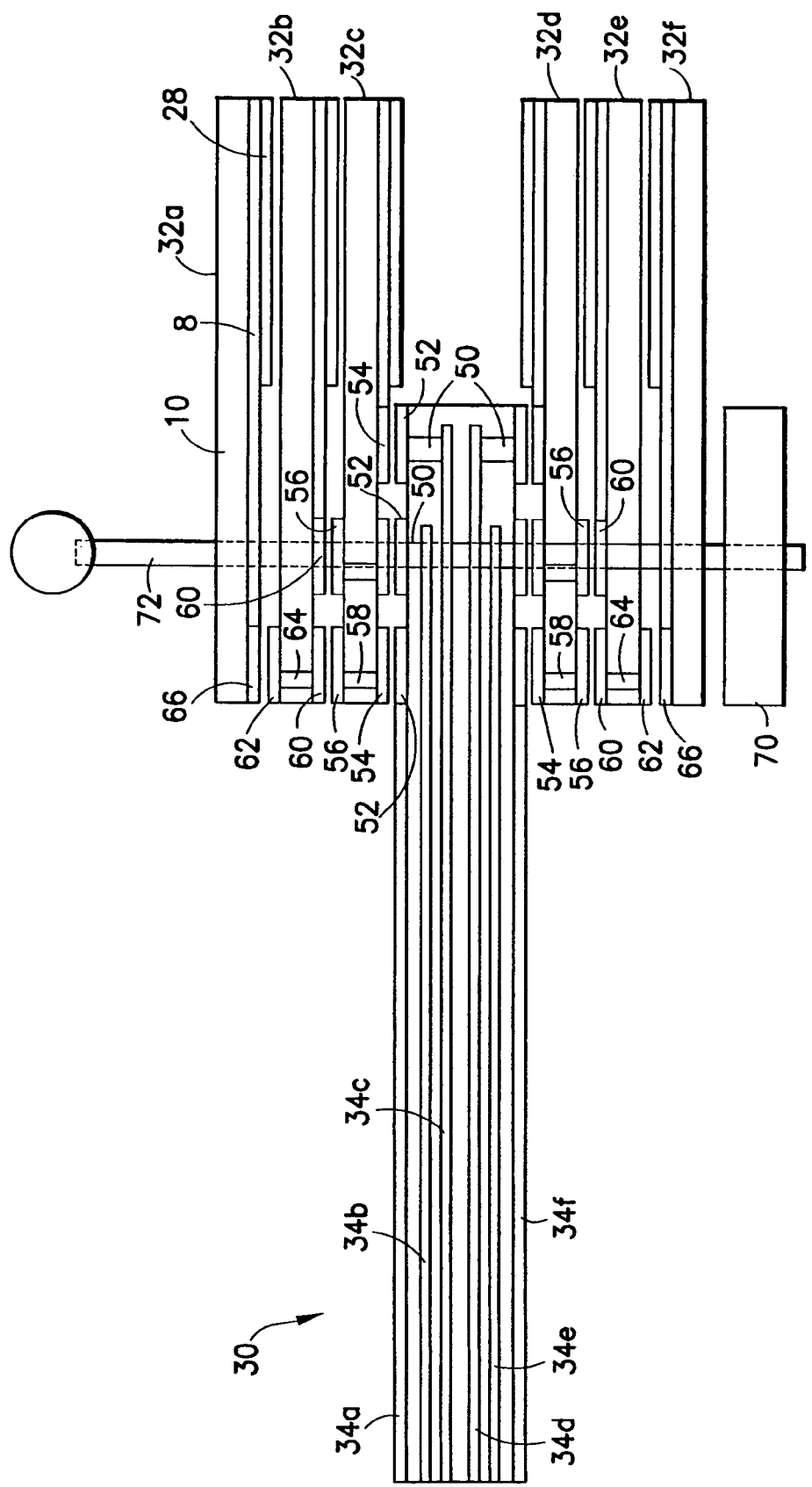
FIG. 4 is a drawing showing a side view of a portion of connector clamped stack in accordance with another embodiment of the invention.

FIG. 4 shows a side view of a portion of a connector clamped stack in accordance with another embodiment of the invention. Again, six transducer flex circuits 32a through 32f are electrically connected to each single multi-layer electronics or cable flex circuit 30, the stack being clamped using a spacer 70 and a bolt 72. Although only one flex circuit 30 is shown in FIG. 4, a clamped connection stack is formed by repeating the connection scheme shown in FIG. 4 multiple times. A respective spacer 70 (only one of which is shown in FIG. 4) is placed between each group of flex circuits in the stack and, if necessary, between the connection stack and the clamping blocks (not shown). [The same considerations apply when selecting materials for the spacer, bolt and circuit boards as previously described with reference to FIG. 3.] The spacer 70 acts as a pressure pad when the clamp is tightened to clamp the stack of flex circuits together. To avoid clutter in the drawing, the clamping arrangement is not shown in FIG. 4.

Each cable flex circuit 30 comprises six sets 34a through 34f of metal traces separated by layers of dielectric material. Each set 34a–34f comprises a multiplicity of spaced-apart metal traces that connect to respective coaxial conductors (not shown). Again, the traces of a particular conductor set are preferably, but not necessarily, generally mutually parallel and at the same elevation. The end of cable flex circuit 30 that electrically connects to the transducer flex circuits 32a–32f has vias 50 that connect the metal traces of embedded sets 34b–34e to respective contact pads 52 on the exterior of the cable flex circuit 30. At the same time, contact pads 52 are formed at the ends of the metal traces in external conductor sets 34a and 34f.

In accordance with the connection scheme depicted in FIG. 4, only two (32c and 32d) of the transducer flex circuits are in physical contact with the cable flex circuit 30. Transducer flex circuits 32c and 32d are electrically connected to the cable flex circuit 30 by means of contact pads 54 that respectively align with and overlap the contact pads 52 on the exterior surfaces of the cable flex circuit. One set of contact pads 54 electrically connects the metal traces of flex circuits 32c and 32d to respective pads 52 that enable connection to the metal traces of embedded conductor sets 34c and 34d in the cable flex circuit 30 when the stack is clamped. The other sets of contact pads 54 are electrically connected to corresponding sets of contact pads 56 formed on the other side of the dielectric substrate of transducer flex circuits 32c and 32d by means of respective sets of vias 58.

The metal traces on transducer flex circuits 32b and 32e are electrically connected to the cable flex circuit 30 by means of contact pads 60 that respectively align with and overlap corresponding sets of contact pads 56 on the transducer flex circuits 32c and 32d respectively. One set of contact pads 60 electrically connects the metal traces of flex circuits 32b and 32e to respective pads 52 on the cable flex circuit 30 (i.e., the pads 52 that connect to the metal traces of embedded conductor sets 34b and 34e) by way of corresponding sets of pads 54 and 56 and vias 58 of transducer flex circuits 32c and 32d. The other set of contact pads 60 are electrically connected to a corresponding set of contact pads 62 formed on the other side of the dielectric substrate of transducer flex circuits 32b and 32e by means of respective sets of vias 64.

The metal traces on transducer flex circuits 32a and 32f are electrically connected to the cable flex circuit 30 by means of contact pads 66 that respectively align with and overlap the contact pads 62 on the transducer flex circuits 32b and 32e respectively. The contact pads 66 electrically connect the metal traces of flex circuits 32a and 32f to respective pads 52 on the cable flex circuit 30 (i.e., the pads 52 that connect to the metal traces of embedded conductor sets 34a and 34f) by way of the corresponding sets of pads 60 and 62 and vias 64 of transducer flex circuits 32b and 32e and by way of the corresponding sets of pads 54 and 56 and vias 58 of transducer flex circuits 32c and 32d.

For the sake of illustration, FIG. 4 depicts the stacked connection with gaps between the opposing sets of pads. However, when the stack is clamped, the opposing pads will be pressed into contact and the gaps will be closed.

Each flex circuit 32a–32f comprises a multiplicity of metal traces 8 printed on a dielectric substrate 10 with a cover layer 28 that covers portions of the metal traces while leaving the pads at the ends of the traces exposed. As seen in FIG. 4, the flex circuits 32a–32c have metal traces on the bottom, while the flex circuits 32d–32f have metal traces on the top. The flex circuits 32a–32f are embedded in an acoustic backing (not shown) in the manner previously described.

In the example depicted in FIG. 4, six circuit boards are electrically connected to a single multi-layer circuit board having embedded metal traces connected to contact pads by means of vias. Again, this connection scheme can be employed with either flexible or rigid circuit boards, and can be extended to connect four or more circuit boards to a single multi-layer circuit board. In a variation of the embodiment depicted in FIG. 4, the number of sets of metal traces in the cable flex circuit can be halved, with contact pads 52 formed on only one side of the cable flex circuit, thereby also halving the number of transducer flex circuits connected to a single cable flex circuit. At a minimum, the cable flex circuit could have only two sets of metal traces, one external and one internal, and only one set of vias, two sets of pads on one side being respectively in contact with the pads of two transducer flex circuits. While such variations illustrate the broad scope of the invention, they are less advantageous embodiments because the number of transducer flex circuits per single cable flex circuit is reduced, thereby reducing the overall density of the connections.

Using circuit boards that have vias and pads, three or more flexible or rigid circuit boards can be stacked and clamped or bonded together. Adjacent boards have matching pad patterns and make electrical contact when the stack is clamped. Boards internal to the stack have contact pads for their own circuits and additional pads with through vias to make connections between neighboring boards.

Although the example depicted in FIG. 4 shows respective metal traces on six transducer flex circuits being respectively connected to six metal traces in the multi-layer cable flex circuit, it should be appreciated that this stacked connection also allows metal traces on different flex circuits to be electrically connected to the same metal trace on the cable flex circuit at the same time. The metal trace on transducer flex circuit 32b could be extended to connect to the contact pad 60 that also connects the metal trace on transducer flex circuit 32a to metal trace 34a on the cable flex circuit 30. [The contact pads 54 and 56 on transducer flex circuit 32c that connects the metal trace on transducer flex circuit 32b to the metal trace 34b on the cable flex circuit would be eliminated in this case.] As a result, a metal trace on transducer flex circuit 32a and a metal trace on transducer flex circuit 32b could both be connected to the same metal trace on the cable flex circuit. Such connections facilitate performing a portion of the beamforming on the transducer probe.

To connect three or more flexible or rigid circuit boards together, the following steps are performed: 1) Define a pattern (array or single row) of contact pads sufficient for all desired electrical connections. Pads must be large enough for through-vias either in the pads or in the spaces between pads. Pads and spaces must be large enough so that reliable contact and no shorts can be achieved with the planned alignment method (e.g., tooling pins). 2) Reproduce the pattern on all contact surfaces between the circuit boards to be stacked and connected. Even though all pads may not be needed on all interfaces, a consistent pattern helps maintain uniform thickness and uniform electrical contact in the stacked boards. 3) Identify which pads each circuit board will use for its connections. All other pads must have "pass-through" via connections between the top and bottom surfaces of the circuit board. 4) Clamp or bond the flexible and/or rigid circuit boards together. If bonding is used, the bond material must be electrically conductive in the thickness direction but not in the lateral directions. Anisotropic conductive film or solder may be used to achieve such bonding.

The embodiments depicted in FIGS. 3 and 4 are examples of how the invention might be implemented. However, it should be appreciated that the fundamental concept of the invention is to create connections between multiple circuit boards arranged in a stack, wherein each circuit board has one or more sets of conductors. In order to appreciate the full scope of the invention, one should avoid associating sets of conductors with respective levels in the circuit board. One set of conductors could be distributed over multiple levels, and/or multiple sets could share the same level.

For example, if one circuit board has steps and each step connects to a separate other circuit board, as shown in FIG. 3, then each step corresponds to a separate set of conductors. But it is not necessarily the case that those conductors remain on a unique level within the circuit board. It is convenient, as in FIG. 3, to show each step associated with a separate conductor set, but the conductors could actually be distributed over more or fewer levels in a circuit board.

If the board-to-board connections are arranged in multiple rows on a single level, as shown in FIG. 4, there is not necessarily any relationship between the number of boards, the number of rows of connections, and the number of sets of conductors within any of the boards. One "set" of conductors (corresponding to connections between a specific pair of boards) could be distributed across multiple rows of contacts and multiple levels internal to a board. In addition, multiple sets of conductors could share the same row or level. It is convenient, as in FIG. 4, to show each set of board-to-board connections on a separate row of contact pads and separate level in the multi-layer board, but it is by no means necessary.

Figure 5:
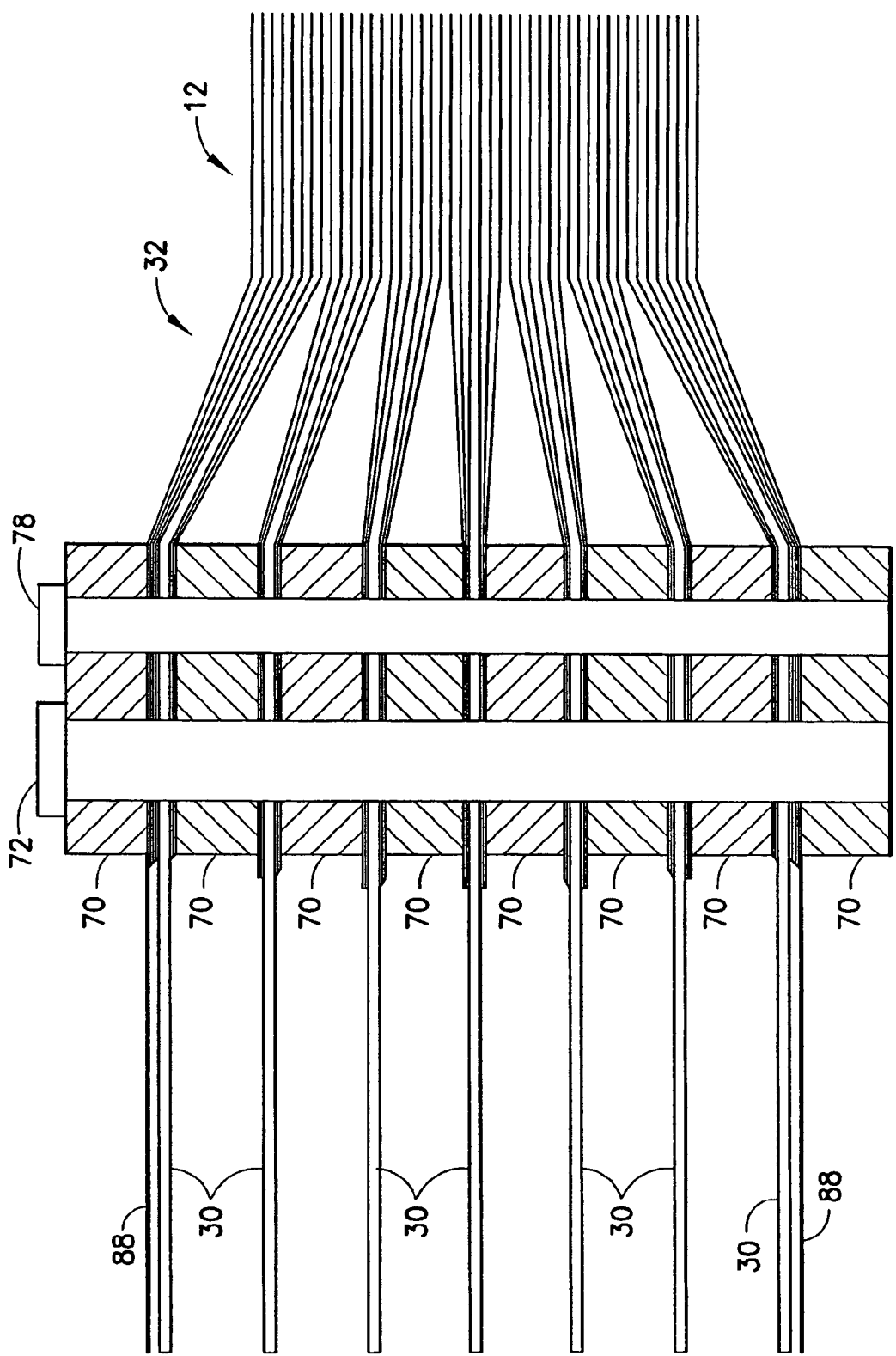
FIG. 5 is a drawing showing a side view of a connector clamped stack comprising long alignment pins in accordance with a further embodiment of the invention.

FIG. 5 shows a side view of a connector clamped stack comprising a clamping bolt 72 and long alignment pins 78 (only one of which is shown) for registration, i.e., alignment, of the circuit boards. Each circuit board (30, 32) has a respective hole through which each alignment pin 78 passes. Each circuit board also has a hole through which the clamping bolt passes. In addition, each spacer 70 has respective holes for the alignment pins and for the clamping bolt. Fanout of the transducer flex circuits 32 from the compact spacing inside the acoustic backing layer 12 to the connection stack causes lateral shifts of the transducer flex circuits relative to the electronics or cable flex circuits 30. Consequently, long holes are needed in the flex circuits for alignment pins and for the clamping bolt. Also larger spaces are needed between rows of circuit board-to-circuit board contact pads to avoid shorting. Respective ground foils 88 are provided for electrical connection to the ground electrodes in the transducer array when the stack of circuit boards and spacers is clamped together. The coefficient of thermal expansion and the stiffness of the spacers are chosen to maintain good clamp pressure over a range of temperatures.

Figure 6:
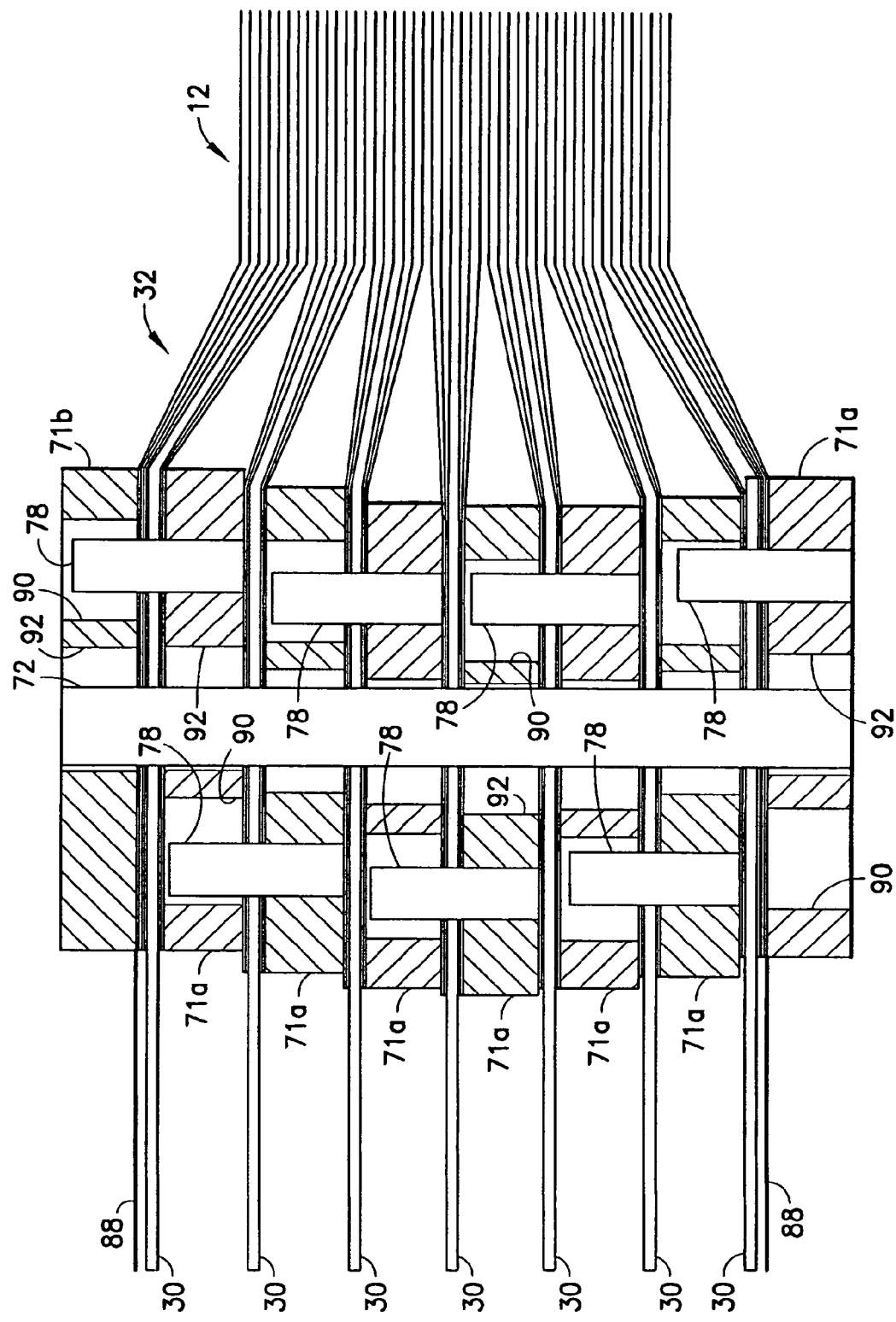
FIG. 6 is a drawing showing a side view of a connector clamped stack comprising short alignment pins in accordance with yet another embodiment of the invention.

Instead of long alignment pins that pass through the entire stack, short alignment pins can be used. FIG. 6 shows a side view of a connector clamped stack comprising short alignment pins in accordance with yet another embodiment of the invention. In accordance with this connection scheme, six transducer flex circuits 32 are connected to each cable flex circuit 30, and the cable flex circuits with respective sets of connected transducer flex circuits are separated from each other by respective spacers 71a, while the flex circuits at the top of the stack are separated from a clamping jaw (not shown) by a spacer 71b that differs in structure from spacers 71a. If the bottom spacer 71a and top spacer 71b are made of a stiff material, such as stainless steel, and are sufficiently thick, then they may function as the clamping jaws. Each of spacers 71a has a bore in which a respective short alignment pin 78 is anchored. The end of each alignment pin projects upward from the spacer in which it is anchored into a hole 90 in the next spacer (71a or 71b). Each spacer also has a hole 92 through which the clamping bolt 72 passes. Fanout of the transducer flex circuits 32 from the compact spacing inside the acoustic backing layer 12 to the connection stack causes lateral shifts of the transducer flex circuits relative to the electronics or cable flex circuits 30. Consequently, long holes are needed in the spacers 71a and 71b for the alignment pins and in all components for the clamping bolt. Long holes are not needed in the circuit boards for the alignment pins since the positions of the spacers are adjustable, which is the reason why the stacked spacers are depicted in FIG. 6 as being out of alignment.

Figure 7:
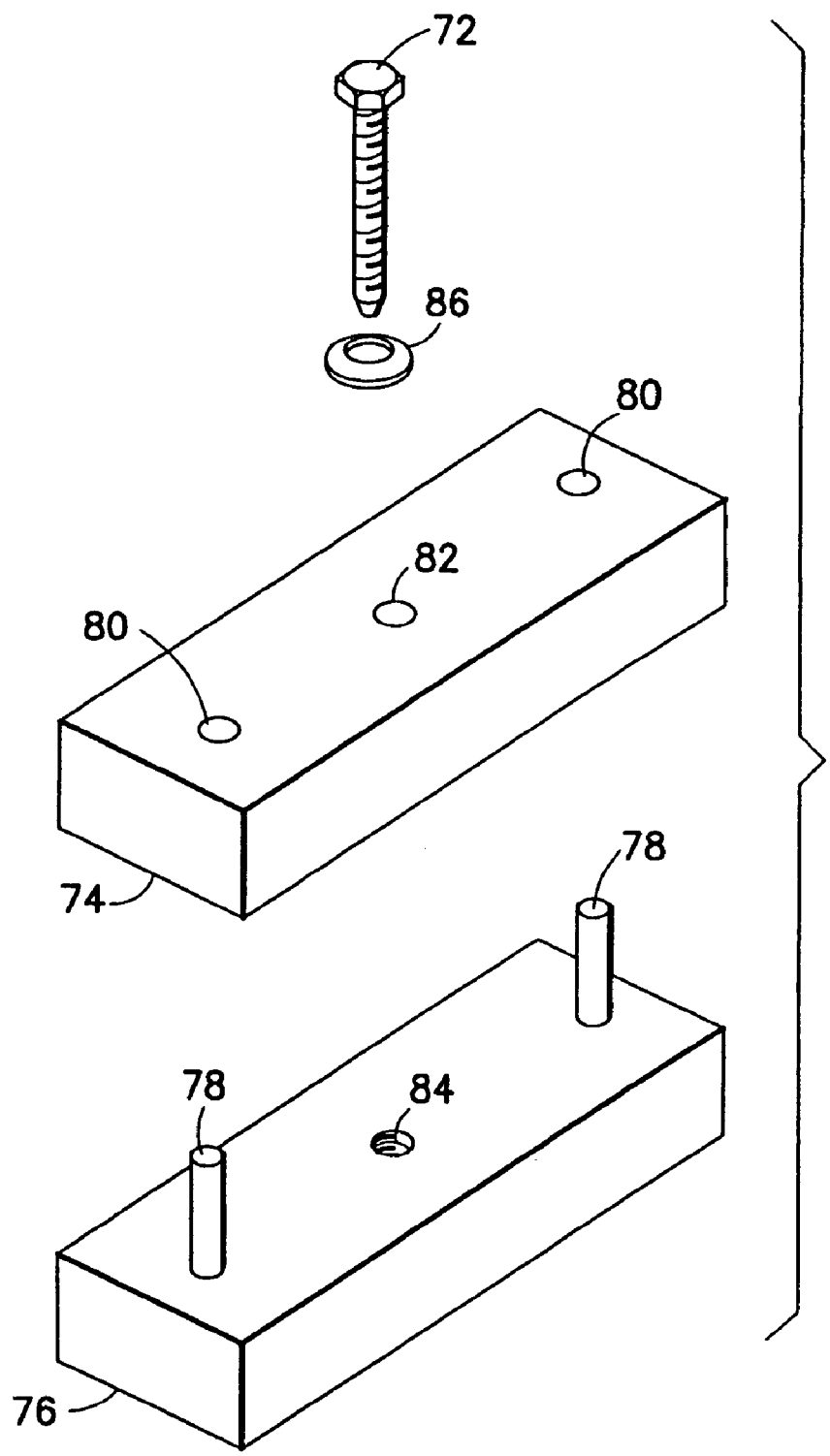
FIG. 7 is a drawing showing a clamping arrangement in accordance with one embodiment of the invention.

FIG. 7 shows a clamping mechanism that can be used in the present invention. It is similar to a mechanism disclosed in U.S. Pat. No. 6,017,244. The mechanism comprises clamping jaws 74 and 76 to clamp a stack of overlapped circuit boards. The mechanism further comprises means for registration of the overlapped portions of the circuit boards. The registration means may comprise a pair of spaced-apart alignment pins 78 mounted to and projecting from one face of clamping jaw 76. In the mechanism shown in FIG. 7, the clamping jaw 74 opposite the alignment pins 78 has receiving recesses 80 that provide clearance to receive the alignment pins when the clamping jaws close toward one another. Each circuit board in the clamped stack must have a pair of registration holes through the dielectric material that align with and receive a corresponding alignment pin. Accordingly, each circuit board will be in fixed registration with the clamping jaws 74 and 76.

The clamping jaws 74 and 76 have clamping surfaces to apply clamping forces on the stack of circuit boards and spacers. A fastener, e.g., bolt 72, urges the clamping jaws to clamp the stack. The bolt 72 extends through a bore 82 through clamping jaw 74 and extends threadably and adjustably along an internally threaded recess 84 formed in the other clamping jaw 76. Advancing the bolt 72 by turning will close the clamping jaws and apply force on each of the overlapping circuit boards in the stack. The bolt 72 passes through a slotted opening (not shown) in each circuit board. The shape and location of such a slotted opening can be seen in FIG. 3 of U.S. Pat. No. 6,017,244. A resiliently deformable stiff spring, e.g., a Belleville (i.e., conical) washer 86, can be clamped between an enlarged head on the bolt 72 and clamping jaw 74. The spring should be resiliently compliant to expand and contract with temperature variations and vibration, so as to apply continuously uniform force on the clamping jaws. In turn, uniform clamping force is applied to the stack of circuit boards to maintain them in pressure contact with one another.

The present invention is not limited to simply connecting a plurality of flex circuits to a multi-layer circuit board. By appropriately arranging the contact pads and vias on the intermediate flex circuits, one could connect from one multi-layer circuit board through several intermediate flexible or rigid circuit boards to another multi-layer circuit board—and perhaps through that board and on to still another. If the spacer is not a simple insulating or conducting block, but is instead a structured "interposer" with "Z-axis" conductors through it, then multiple connections can be carried through the spacer. Such Z-axis interposer materials are commercially available, either as bondable adhesives or simply as spacers.

Figure 8:
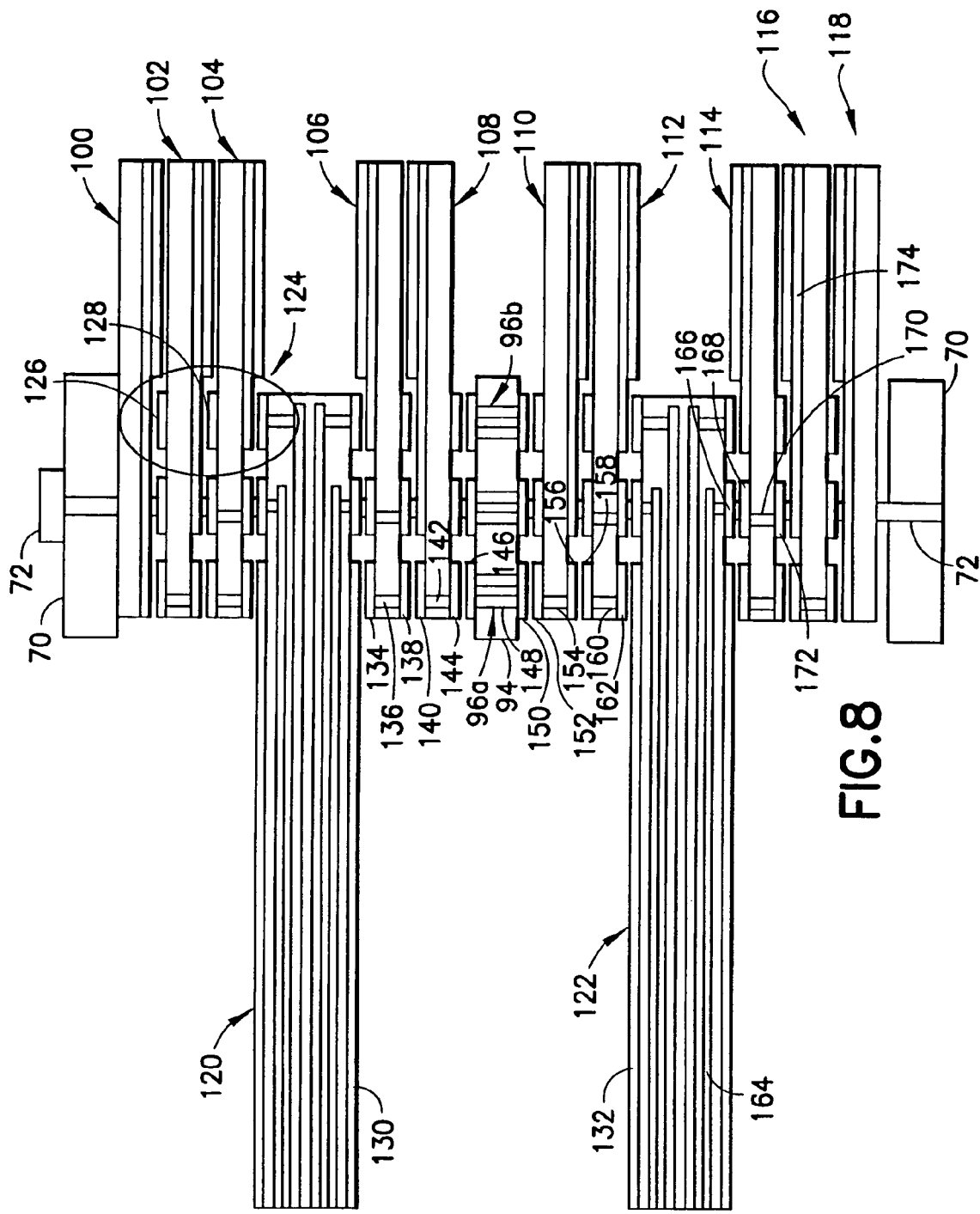
FIG. 8 is a drawing showing a side view of a connector clamped stack in accordance with yet another embodiment of the invention.

Such a stacked interconnection between multiple circuit boards is depicted in FIG. 8. The stack comprises ten flex circuits designated by even numbers from 100 to 118, and two multi-layer circuit boards 120 and 122, all held together between top and bottom spacers 70 by a bolt 72. Two sub-stacks (i.e., the sub-stack consisting of boards 100, 102, 104, 120, 106 and 108 and the sub-stack consisting of boards 110, 112, 122, 114, 116 and 118) are separated by an electrically insulating spacer/interposer 94 having Z-axis electrical conductors 96a, 96b, etc. Each sub-stack is similar to the stack shown in FIG. 4, except that the embodiment shown in FIG. 8 illustrates the use of a similar metal pad pattern on all surfaces of all circuits, to maintain uniform stack thickness in all contact pad locations and therefore uniform pressure under the clamp. One such metal pad pattern can be seen within the ellipse 124, wherein contact pads 126 and 128, which serve no electrical connection function, have been respectively formed on flex circuits 102 and 104 in order to maintain uniform stack thickness. For example, contact pad 128 contacts the bottom trace on flex circuit 102, but does not electrically connect that trace to any other trace.

FIG. 8 also illustrates a board-to-board electrical connection through a plurality of stacked flex circuits 106, 108, 110, 112 and the spacer/interposer 94. More specifically, trace 130 on circuit board 120 is electrically connected to trace 132 on circuit board 122 by means of contact pads 134, via 136 through flex circuit 106, contact pads 138 and 140, via 142 through flex circuit 108, pads 144 and 146, via 148 through interposer 94, pads 150 and 152, via 154 through flex circuit 110, contact pads 156 and 158, via 160 through flex circuit 112, and pad 162. Alternatively, the spacer/interposer 94 could be removed and board 120 could be electrically connected to board 122, via the flex circuits 106, 108, 110, 112, with pad 144 of flex circuit 108 being in contact with pad 152 of flex circuit 110.

FIG. 8 further illustrates board-to-flex circuit electrical connections through another flex circuit. For example, circuit board 122 is electrically connected to flex circuit 116 by way of flex circuit 114. More specifically, trace 164 on circuit board 122 is electrically connected to trace 174 on circuit board 116 by means of contact pads 166 and 168, via 170 through flex circuit 114, and contact pad 172.

The stacked circuits need not be in-line, but could approach the stacked connection from multiple directions or angles. The pattern of contact pads could be a linear array of pads, two or a few rows, a square array of pads, or other patterns. FIG. 9 illustrates four circuit boards 176, 178, 180, 182 approaching a stack from four mutually orthogonal directions, with electrical connections between traces 186 on the substrates 184 of these boards being made via a square array of pads 98 and vias (not shown). The respective sets of pads 98 on the boards are registered using two (or more) alignment pins 78. The stack of boards is held together by a clamping arrangement comprising a clamping bolt 72 and spacers (not shown), as previously described.

Using the present invention, a high density of electrical connections between multiple circuit boards may be achieved in a compact space with a single assembly step. If the boards are clamped and not bonded, then the assembly is easily reworked. For two-dimensional ultrasound arrays, this allows many (e.g., ~50) transducer flex circuits to be connected to a small number (e.g., <10) of electronics boards. Each electronics board can access a two-dimensional subarray (several rows) of transducer elements, so three-dimensional beamforming can be employed for those elements. This allows a substantial (e.g., 16×) reduction in the number of connections between the imaging system and the two-dimensional transducer array probe.

For the sake of illustration, high-density electrical connectors for connecting flex circuits of an ultrasonic transducer probe to flex circuits that connect to an ultrasound imaging system have been disclosed. However, the invention disclosed herein is not limited in its application to connecting flex circuits to each other. The same connection schemes can be applied for connecting flex circuits to rigid printed circuit boards or for connecting rigid printed circuit boards to each other. Also the invention has application in areas beyond ultrasonic imaging systems. The broad scope of the invention encompasses the connection of multiple circuit boards without regard to the systems or circuits that are connected to those circuit boards.

While the invention has been described with reference to preferred embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

As used in the claims, the term "circuit board" means any substrate having metal traces thereon and/or therein, regardless of whether the substrate is flexible or rigid. As used in the claims, the term "in contact" means a) in direct physical and electrical contact; or b) on adjacent opposing surfaces and electrically connected by solder, anisotropic conductive film (ACF), or other electrically conductive material.

What is claimed is:

1. A stacked connection comprising:
first, second and third circuit boards having respective overlapping portions, said first circuit board comprising a substrate supporting first and second sets of electrical conductors, said second circuit board comprising a substrate supporting first and second sets of electrical conductors, and said third circuit board comprising a substrate supporting a first set of electrical conductors, wherein said second set of electrical conductors of said second circuit board are respectively in contact with said second set of electrical conductors of said first circuit board, and said first set of electrical conductors of said third circuit board are respectively electrically coupled to said first set of electrical conductors of said first circuit board by way of said first set of electrical conductors of said second circuit board, wherein each of said first set of electrical conductors of said second circuit board comprises a first pad on one side of said substrate of said second circuit board, a second pad on another side of said substrate of said second circuit board, and a via through said substrate of said second circuit board that electrically connects said first pad to said second pad.

2. The stacked connection as recited in claim 1, wherein a first portion of said second circuit board is bonded to a portion of said first circuit board, and a portion of said third circuit board is bonded to a second portion of said second circuit board.

3. The stacked connection as recited in claim 1, wherein a first portion of said second circuit board is soldered to a portion of said first circuit board, and a portion of said third circuit board is soldered to a second portion of said second circuit board.

4. The stacked connection as recited in claim 1, further comprising a clamp that clamps said first through third circuit boards together.

5. The stacked connection as recited in claim 1, wherein said third circuit board further comprises a second set of electrical conductors supported by said substrate of said third circuit board, further comprising a fourth circuit board, said fourth circuit board comprising a substrate supporting a set of electrical conductors, wherein said set of electrical conductors of said fourth circuit board are respectively electrically coupled to said first set of electrical conductors of said first circuit board by way of said first sets of electrical conductors of said second and third circuit boards connected in series.

6. The stacked connection as recited in claim 1, wherein said first circuit board further comprises third and fourth sets of electrical conductors, said stacked connection further comprising fourth and fifth circuit boards having respective portions forming parts of said stack, said fourth circuit board comprising a substrate supporting first and second sets of electrical conductors, and said fifth circuit board comprising a substrate supporting a first set of electrical conductors, wherein said first set of electrical conductors of said fifth circuit board are respectively electrically coupled to said third set of electrical conductors of said first circuit board by way of said first set of electrical conductors of said fourth circuit board.

7. The stacked connection as recited in claim 1, wherein each electrical conductor of said first set of said first circuit board comprises a metal trace and a pad on said surface of said substrate of said first circuit board, said metal trace being connected to said pad, and each electrical conductor of said second set of said first circuit board comprises a metal trace embedded below said surface of said substrate of said first circuit board, a pad on said surface of said substrate of said first circuit board, and a via through said substrate of said first circuit board that electrically connects said metal trace to said pad.

8. The stacked connection as recited in claim 1, further comprising a body of acoustically attenuative material, wherein the ends of said second and third circuit boards remote from said first circuit board are embedded in said body of acoustically attenuative material.

9. A stacked connection comprising:
   a first circuit board comprising a substrate and first and second sets of electrical conductors supported by said substrate, the electrical conductors of said first set extending beyond the electrical conductors of said second set, and each of said electrical conductors of said first and second sets having a respective termination portion that is exposed on one side of said substrate, said termination portions of said electrical conductors of said first set being displaced in a direction perpendicular to said substrate of said first circuit board relative to said termination portions of said electrical conductors of said second set;
   a second circuit board comprising a substrate and a set of electrical conductors supported by said substrate of said second circuit board, each of said electrical conductors of said second circuit board having a respective termination portion that is exposed on one side of said substrate of said second circuit board, the termination portions of said electrical conductors of said second circuit board being respectively in contact with the termination portions of said electrical conductors of said first set of said first circuit board; and
   a third circuit board comprising a substrate and a set of electrical conductors supported by said substrate of said third circuit board, each of said electrical conductors of said third circuit board having a respective termination portion that is exposed on one side of said substrate of said third circuit board, the termination portions of said electrical conductors of said third circuit board being respectively in contact with the termination portions of said electrical conductors of said second set of said first circuit board.

10. The stacked connection as recited in claim 9, wherein portions of said second and third circuit boards are bonded to respective portions of said first circuit board.

11. The stacked connection as recited in claim 9, wherein portions of said second and third circuit boards are soldered to respective portions of said first circuit board.

12. The stacked connection as recited in claim 9, further comprising a clamp that clamps said first through third circuit boards together.

13. The stacked connection as recited in claim 9, wherein said substrate of said first circuit board comprises first and second steps, the termination portions of said electrical conductors of said first set being disposed on said first step and the termination portions of said electrical conductors of said second set being disposed on said second step.

14. The stacked connection as recited in claim 9, wherein the termination portions of said electrical conductors of said first through third circuit boards are pads.

15. The stacked connection as recited in claim 9, wherein said first circuit board further comprises a third set of electrical conductors supported by said substrate of said first circuit board, the electrical conductors of said second set extending beyond the electrical conductors of said third set, and each of said electrical conductors of said third set having a respective termination portion that is exposed on said one side of said substrate of said first circuit board, said termination portions of said electrical conductors of said third set being displaced in a direction perpendicular to said substrate of said first circuit board relative to said termination portions of said electrical conductors of said first and second sets, further comprising:
   a fourth circuit board comprising a substrate and a set of electrical conductors supported by said substrate of said fourth circuit board, each of said electrical conductors of said fourth circuit board having a respective termination portion that is exposed on one side of said substrate of said fourth circuit board, the termination portions of said electrical conductors of said fourth circuit board being respectively in contact with the termination portions of said electrical conductors of said third set of said first circuit board.

16. The stacked connection as recited in claim 15, wherein said substrate of said first circuit board comprises first, second and third steps, the termination portions of said electrical conductors of said first set being disposed on said first step, the termination portions of said electrical conductors of said second set being disposed on said second step, and the termination portions of said electrical conductors of said third set being disposed on said third step.

17. The stacked connection as recited in claim 9, wherein said first circuit board further comprises third and fourth sets of electrical conductors supported by said substrate of said first circuit board, the electrical conductors of said third set extending as far as the electrical conductors of said first set, and the electrical conductors of said fourth set extending as far as the electrical conductors of said second set, each of said electrical conductors of said third and fourth sets having a respective termination portion that is exposed on a side of said substrate of said first circuit board that is opposite to said one side of said substrate of said first circuit board, further comprising:
   a fourth circuit board comprising a substrate and a set of electrical conductors supported by said substrate of said fourth circuit board, each of said electrical conductors of said fourth circuit board having a respective termination portion that is exposed on one side of said substrate of said fourth circuit board, the termination portions of said electrical conductors of said fourth circuit board being respectively in contact with the termination portions of said electrical conductors of said third set of said first circuit board; and
   a fifth circuit board comprising a substrate and a set of electrical conductors supported by said substrate of said fifth circuit board, each of said electrical conductors of said fifth circuit board having a respective termination portion that is exposed on one side of said substrate of said fifth circuit board, the termination portions of said electrical conductors of said fifth circuit board being respectively in contact with the termination portions of said electrical conductors of said fourth set of said first circuit board.

18. The stacked connection as recited in claim 9, further comprising a body of acoustically attenuative material, wherein the ends of said second and third circuit boards remote from said first circuit board are embedded in said body of acoustically attenuative material.

19. A stacked connection comprising:
a first circuit board comprising a substrate and first and second sets of electrical conductors supported by said substrate, each of said electrical conductors of said first and second sets having a respective termination portion that is exposed on one side of said substrate;
a second circuit board comprising a substrate and first and second sets of electrical conductors supported by said substrate of said second circuit board, each of said electrical conductors of said first set of said second circuit board having a respective termination portion that is exposed on one side of said substrate of said second circuit board, and each of said electrical conductors of said second set of said second circuit board having a respective first termination portion that is exposed on said one side of said substrate of said second circuit board and a respective second termination portion that is exposed on a side of said substrate of said second circuit board opposite to said one side of said substrate of said second circuit board, the termination portions of said electrical conductors of said first set of said second circuit board and the first termination portions of said electrical conductors of said second set of said second circuit board being respectively in contact with the termination portions of said electrical conductors of said first and second sets of said first circuit board; and
a third circuit board comprising a substrate and a set of electrical conductors supported by said substrate of said third circuit board, each of said electrical conductors of said set of said third circuit board having a respective termination portion that is exposed on one side of said substrate of said third circuit board, the termination portions of said electrical conductors of said set of said third circuit board being respectively in contact with the second termination portions of said electrical conductors of said second set of said second circuit board, whereby said set of electrical conductors of said third circuit board are electrically connected to said second set of electrical conductors of said first circuit board by means of said second set of electrical conductors of said second circuit board.

20. An apparatus comprising:
first and second stacked connections and a spacer disposed between said first and second stacked connections, said first stacked connection comprising first and second circuit boards, said second stacked connection comprising third and fourth circuit boards, wherein said spacer comprises a first set of electrical conductors, said first circuit board comprises a second set of electrical conductors, and said fourth circuit board comprises a third set of electrical conductors, said electrical conductors of said second set being respectively electrically connected to said electrical conductors of said third set by way of said electrical conductors of said first set; and
an alignment pin that projects through respective aligned openings in said circuit boards of said first and second stacked connections and in said spacer.

21. The apparatus as recited in claim 20, wherein said second circuit board is disposed between said first circuit board and said spacer, wherein said second circuit board comprises a fourth set of electrical conductors, said electrical conductors of said second set being respectively electrically connected to said electrical conductors of said first set by way of said electrical conductors of said fourth set.

22. A stack of partially overlapping circuit boards, comprising:
a central circuit board comprising a substrate and first through fourth sets of electrical conductors, each of said electrical conductors having a termination portion, wherein the termination portions of said electrical conductors of said first and second sets are exposed on one side of said substrate, and the termination portions of said electrical conductors of said third and fourth sets are exposed on another side of said substrate opposite to said one side of said substrate;
first and second interior circuit boards each comprising a respective substrate and respective first and second sets of electrical conductors having termination portions, said termination portions of said first set of electrical conductors of said first interior circuit board being respectively in contact with the termination portions of said first set of electrical conductors of said central circuit board, said termination portions of said second set of electrical conductors of said first interior circuit board being respectively in contact with the termination portions of said second set of electrical conductors of said central circuit board, said termination portions of said first set of electrical conductors of said second interior circuit board being respectively in contact with the termination portions of said third set of electrical conductors of said central circuit board, and said termination portions of said second set of electrical conductors of said second interior circuit board being respectively in contact with the termination portions of said fourth set of electrical conductors of said central circuit board; and
first and second exterior circuit boards each comprising a respective substrate and a respective set of electrical conductors, said set of electrical conductors of said first exterior circuit board being electrically connected to said second set of electrical conductors of said central circuit board by way of said second set of electrical conductors of said first interior circuit board, and said set of electrical conductors of said second exterior circuit board being electrically connected to said fourth set of electrical conductors of said central circuit board by way of said second set of electrical conductors of said second interior circuit board.

23. The stack as recited in claim 22, wherein each of said termination portions comprises a pad.

24. The stack as recited in claim 22, wherein each electrical conductor of said first set of said central circuit board comprises a metal trace embedded below the surface on said one side of said substrate of said central circuit board, a pad on the surface of said one side of said substrate of said central circuit board, and a via through said substrate of said central circuit board that electrically connects said metal trace to said pad.

25. The stack as recited in claim 22, wherein each electrical conductor of said second set of said first interior circuit board comprises respective first and second pads on the surfaces of opposite sides of said substrate of said first interior circuit board, and a via through said substrate of said first interior circuit board that electrically connects said first pad to said second pad.

* * * * *

UNITED STATES PATENT AND TRADEMARK OFFICE
CERTIFICATE OF CORRECTION

PATENT NO. : 6,974,333 B2 Page 1 of 1
APPLICATION NO. : 10/813945
DATED : December 13, 2005
INVENTOR(S) : Douglas Glenn Wildes, Robert Stephen Lewandowski and Geir Ultveit Haugen It is certified that error appears in the above-identified patent and that said Letters Patent is hereby corrected as shown below:

Col. 17 lines 54-67 & Col. 18 lines 1-11
Claims 20 and 21 as they now read should be deleted in their entirety.

Claims 20 and 21 should read as follows:

--20. An apparatus comprising:
first, second and third stacked connections, a first spacer disposed between said first and second stacked connections, and a second spacer disposed between said second and third stacked connections, each of said first, second and third stacked connections comprising a respective plurality of circuit boards,
wherein said second spacer comprises a hole and each circuit board of said second stacked connection comprises a respective opening, further comprising a first alignment pin anchored in said first spacer and projecting through said openings in said circuit boards of said second stacked connection and into said hole in said second spacer; and
a clamp that clamps said first through third stacked connections and said first and second spacers together, said clamp comprising a bolt, wherein each of said first through third stacked connections has an opening penetrated by said bolt, and each of said first and second spacers has a hole penetrated by said bolt.

21. The apparatus as recited in claim 20, further comprising:
a fourth stacked connection comprising a plurality of circuit boards, and
a third spacer disposed between said third and fourth stacked connections, wherein said third spacer comprises a hole and each circuit board of said third stacked connection comprises a respective opening, further comprising a second alignment pin anchored in said second spacer and projecting through said openings in said circuit boards of said third stacked connection and into said hole in said third spacer.--

Signed and Sealed this

Ninth Day of March, 2010

David J. Kappos
*Director of the United States Patent and Trademark Office*